United States Patent [19]
Ohashi

[11] Patent Number: 5,912,496
[45] Date of Patent: Jun. 15, 1999

[54] SEMICONDUCTOR DEVICE HAVING POWER MOS TRANSISTOR INCLUDING PARASITIC TRANSISTOR

[75] Inventor: Ikuo Ohashi, Tokyo, Japan

[73] Assignee: NEC Corporation, Tokyo, Japan

[21] Appl. No.: 08/795,630

[22] Filed: Feb. 6, 1997

[30] Foreign Application Priority Data

Feb. 6, 1996 [JP] Japan .................................. 8-020159

[51] Int. Cl.[6] .................................................. H01L 23/62
[52] U.S. Cl. ........................... 257/355; 257/357; 257/358
[58] Field of Search .................................. 257/173, 355, 257/357, 358, 360, 363; 361/86, 111

[56] References Cited

U.S. PATENT DOCUMENTS 4,692,781  9/1987  Rountree et al. .................... 357/23.13

FOREIGN PATENT DOCUMENTS 60-200617  10/1985  Japan .
62-145919  6/1987  Japan .
3-188666  8/1991  Japan .
8-227991  9/1996  Japan .

OTHER PUBLICATIONS

Bruun et al., "Reverse–Voltage Protection Methods for CMOS Circuits", IEEE Journal of Solid–State Circuits, vol. 24, No. 1, pp. 100–103, Feb. 1989.

*Primary Examiner*—Weil M. Fahmy
*Attorney, Agent, or Firm*—Foley & Lardner

[57] ABSTRACT

A semiconductor device has a power MOSFET 12 connected between a semiconductor substrate 21 of N-type as an output terminal 15 and a GND terminal 16 connected to a first semiconductor layer 22 formed on the semiconductor substrate 21 and having a gate connected to a first node for controlling the supply of electric current to a load connected between the GND terminal and the output terminal, a control circuit receiving an input signal and controlling an operation of the power MOSFET in response to the input signal, an input terminal provided in a second semiconductor layer 23 of N-type formed on the first semiconductor layer 22, a parasitic transistor 24 connected between the semiconductor substrate and the second semiconductor layer, and having a base connected to the first semiconductor layer, and switching circuit for keeping the parasitic transistor at a non-conductive state.

6 Claims, 9 Drawing Sheets

SEMICONDUCTOR DEVICE HAVING POWER MOS TRANSISTOR INCLUDING PARASITIC TRANSISTOR

BACKGROUND OF THE INVENTION

1. Field of the Invention

The present invention relates to a semiconductor device and, more particularly, to a semiconductor device including a power metal oxide silicon field effect transistor.

2. Description of the Related Art

A power metal oxide silicon field effect transistor (MOSFET) has been widely used recently because it can drive a large load at a high speed.

Figure 6:
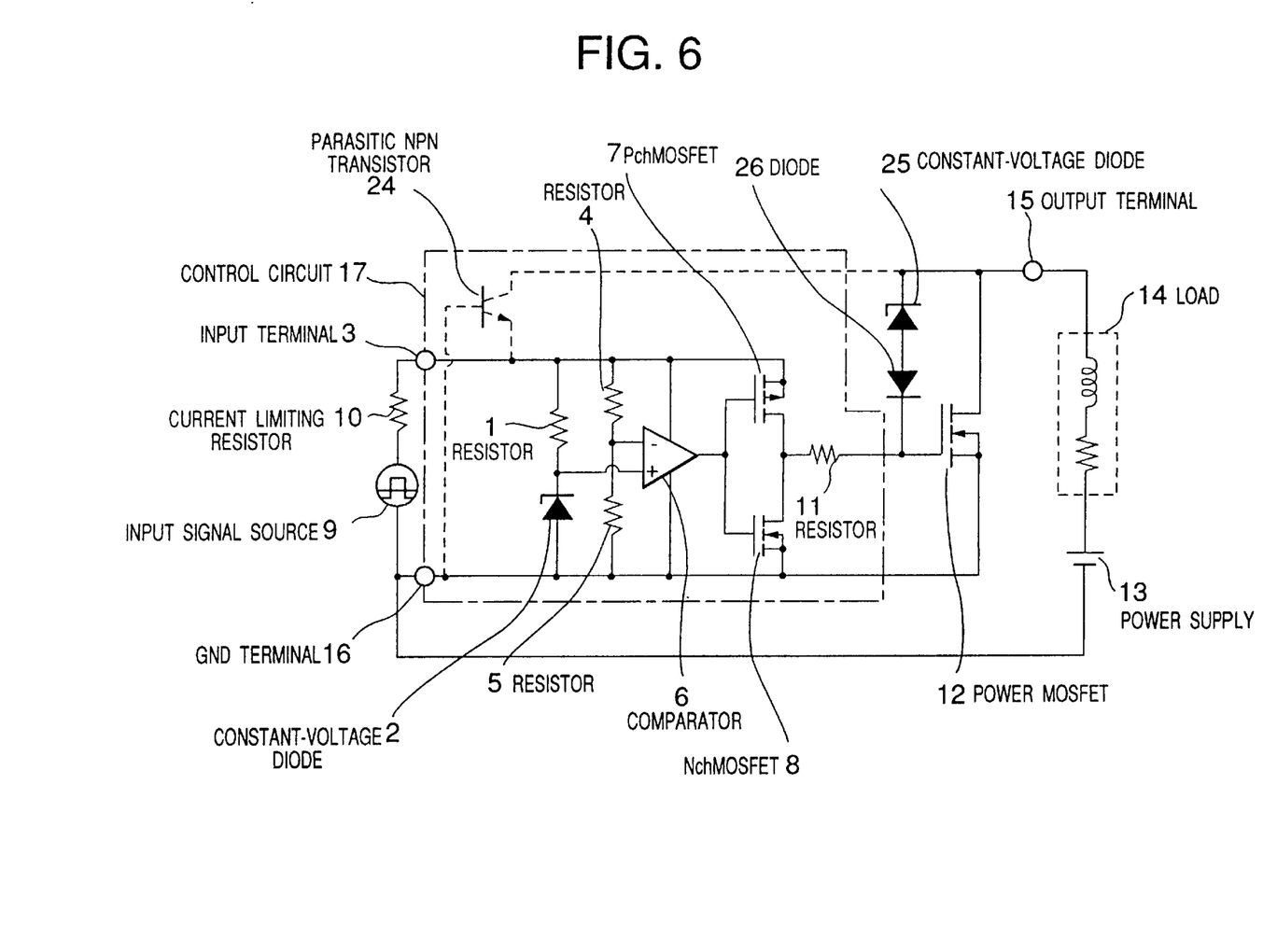
FIG. 6 is a circuit diagram showing a conventional semiconductor device.

A circuit diagram illustrating a conventional semiconductor device is in FIG. 6.

As shown in FIG. 6, the conventional semiconductor device is constituted by an input signal source 9 for generating an input signal, a current limiting resistor 10 for limiting electric current flowing through the device, a power supply 13, a load 14, a power MOSFET 12 for controlling the supply of current to the load 14, a constant-voltage diode 25, a diode 26, and a control circuit 17 for controlling the operation of the power MOSFET 12; provided in the control circuit 17 and connected in parallel between an input terminal 3 and a GND terminal 16 are a resistor 1 and a constant-voltage diode 2, resistors 4 and 5, a comparator 6 for performing comparison of the value of the voltage which has undergone the division through the resistors 4, 5, and a P channel (Pch) MOSFET 7 and an N channel (Nch) MOSFET 8 in which the outputs from the comparator 6 are applied to the gate terminals thereof, a resistor 11 also being included in the control circuit 17, which resistor 11 has one end thereof connected to the drain terminals of the PchMOSFET 7 and NchMOSFET 8 and the other end thereof connected to the gate terminal of the power MOSFET 12; and there is also included a parasitic NPN bipolar transistor 24 having an emitter terminal thereof connected to the input terminal 3 and a collector terminal thereof connected to an output terminal 15.

Figure 7:
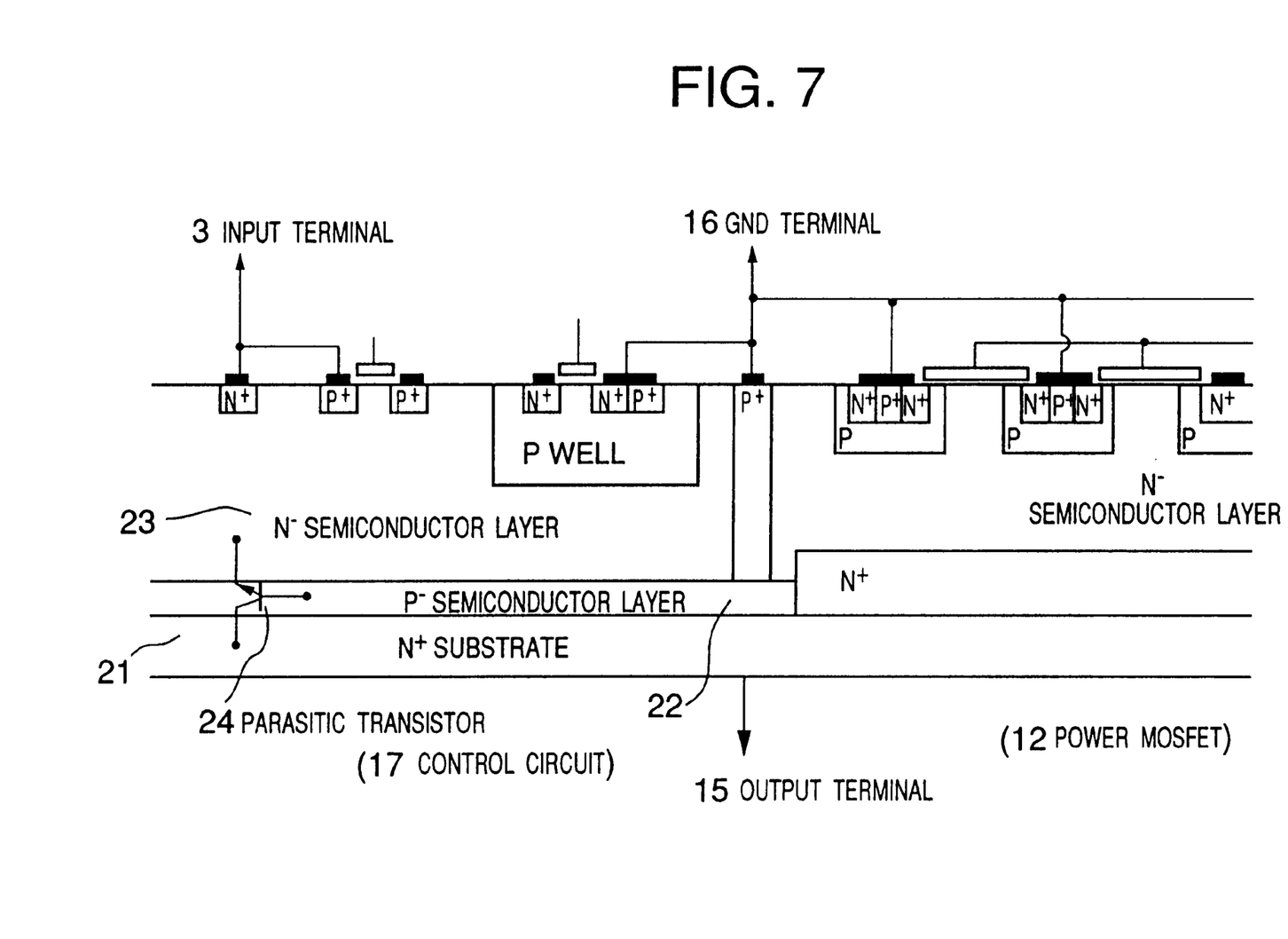
FIG. 7 is a cross-sectional view illustrating the structure of the semiconductor device shown in FIG. 6.

FIG. 7 is a cross-sectional view showing the structure of the semiconductor device illustrated in FIG. 6.

As shown in FIG. 7, the conventional semiconductor device is comprised of an N$^+$ substrate 21 serving as the output of the power MOSFET 12, a P$^-$ semiconductor layer 22 joined onto the N$^+$ substrate 21, and an N$^-$ semiconductor layer 23 which is joined onto the P$^-$ semiconductor layer 22 and which has the control circuit 17.

The operation of the semiconductor device configured as described above will now be described.

Figure 8:
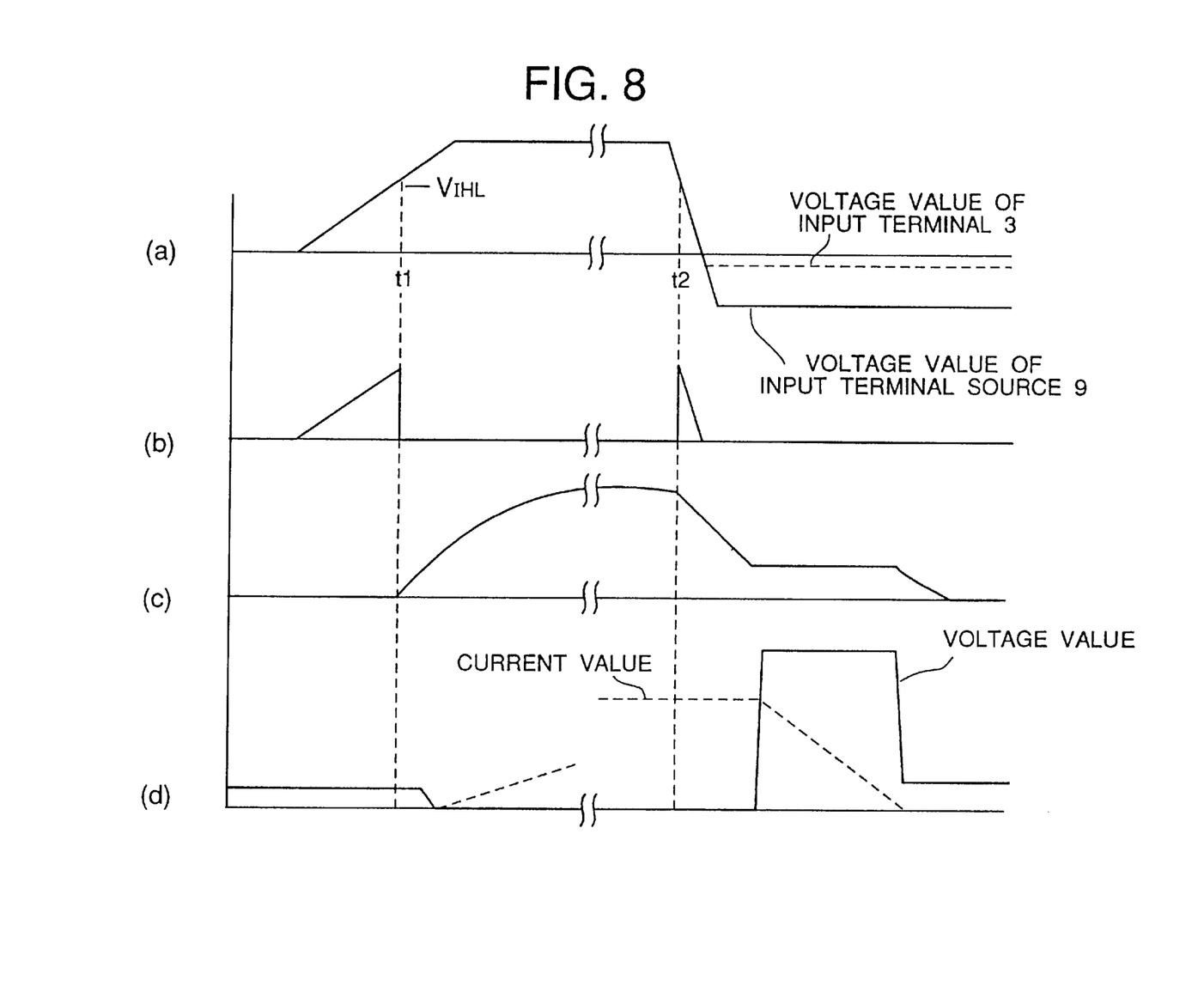
FIG. 8 a diagram for illustrating the operation of the semiconductor device shown in FIG. 6 and FIG. 7; (a) is a chart showing the voltage of a signal issued from an input signal source 9 and the voltage value at an input terminal 3, (b) is a chart showing the output voltage of a comparator 6, (c) is a chart showing the gate voltage of a power MOSFET 12, and (d) is a chart showing the voltage value and the current value at an output terminal 15.

FIG. 8 illustrates the operation of the semiconductor device shown in FIG. 6 and FIG. 7; (a) shows the voltage of a signal output from the input signal source 9 and the voltage value at the input terminal 3, (b) illustrates the output voltage of the comparator 6, (c) illustrates the gate voltage of the power MOSFET 12, and (d) illustrates the voltage value and the current value at the output terminal 15.

When the voltage output from the input signal source 9 rises and when the value of the voltage, which has undergone the division through the resistors 4 and 5, exceeds the constant voltage of the constant-voltage diode 2 (t1) via PchMOSFET 7, the output of the comparator 6 switches to a low level.

This turns the PchMOSFET 7 ON and turns the NchMOSFET 8 OFF.

Thus, electric charge is accumulated at the gate of the power MOSFET 12 and the power MOSFET 12 is placed in an ON state, causing electric current to flow into the load 14.

Next, the voltage output from the input signal source 9 lowers and when the value of the voltage, which has undergone the division through the resistors 4 and 5, goes down to the constant voltage of the constant-voltage diode 2 or lower (t2) via Nch MOSFET 8, the output of the comparator 6 switches to a high level.

Then the PchMOSFET 7 turns OFF, whereas the NchMOSFET 8 turns ON.

This causes the electric charge, which has been accumulated at the gate of the power MOSFET 12, to be discharged, and the power MOSFET 12 is changed to an OFF state.

And the reactance component of the load 14 leads to a rise in the voltage at the output terminal 15, and when the voltage at the output terminal 15 exceeds the constant voltage value of the constant-voltage diode 25, electric current flows from the NchMOSFET 8 to the GND terminal 16 or from the drain of the PchMOSFET 7 to the input terminal 3 through the constant-voltage diode 25, the diode 26, and the resistor 11.

This in turn causes the gate voltage of the power MOSFET 12 to be continued to be biased; the bias allows electric current to flow into the power MOSFET 12 due to so-called "dynamic clamping."

In the conventional semiconductor device described above, however, the parasitic NPN transistor 24 is actuated whenever the voltage at the input terminal 3 drops below the voltage at the GND terminal 16, posing a problem in that electric current flows from the output terminal 15 to the input terminal 3, damaging the device.

More specifically, as shown in FIG. 7, in the foregoing conventional example, the parasitic NPN transistor 24 is designed so that the N$^+$ substrate 21 serves as the collector, the P$^-$ semiconductor layer 22 serves as the base, and the N$^-$ semiconductor layer 23 serves as the emitter; therefore, with the voltage applied to the output terminal 15, the voltage at the input terminal 3 becomes lower than the voltage at the GND terminal 16, and when the difference therebetween exceeds the voltage between the base and the emitter to cause electric current to flow from the GND terminal 16 to the input terminal 3, thus undesirable actuating the parasitic NPN transistor 24.

In particular, when a high voltage (e.g. 70 V) is applied to the output terminal 15 in such a case as the dynamic clamping, a second breakdown which is peculiar to a bipolar transistor results with a consequence greater chance of damage to the device.

To cope with the difficulty, a device for protecting a semiconductor device from damage has been disclosed in Japanese Patent Application Laid Open No. Hei 5-58583.

Figure 9:
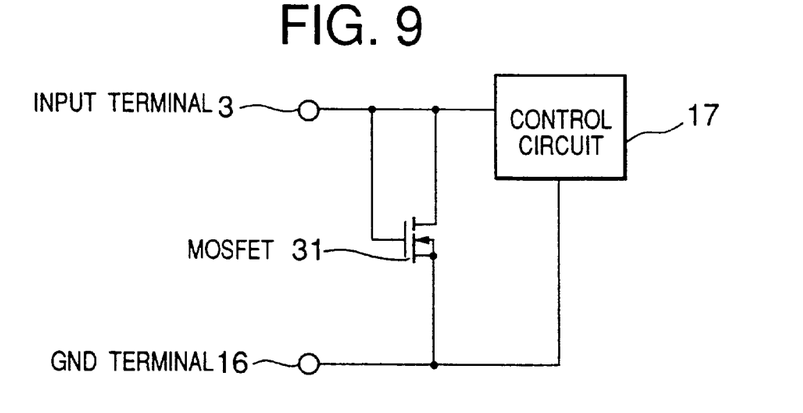
FIG. 9 is a block diagram showing the sketch of the conventional semiconductor device.

FIG. 9 is a block diagram illustrative of the sketch of the semiconductor device.

As shown in FIG. 9, the device includes a MOSFET 31 having a high threshold voltage $V_T$ connected between the input terminal 3 and the GND terminal 16; when static electricity is applied to the input terminal 3 and when the voltage between the input terminal 3 and the GND terminal 16 exceeds the threshold voltage $V_T$ (approximately 20 to 25 V in this example), the second breakdown results, thus turning the MOSFET 31 ON.

However, the problem in the semiconductor device shown in FIG. 6 is the damage to the device caused by the parasitic NPN transistor 24 which is actuated when the voltage at the input terminal 3 is lower than the voltage at the GND terminal 16; therefore, the publicly known example illustrated in FIG. 9 does not make sense.

There is another publicly known example, namely, "Supply Terminal Protection" of "Reverse-Voltage Protection Methods for CMOS Circuits" (IEEE JOURNAL Vol24, February 1989).

Figure 10:
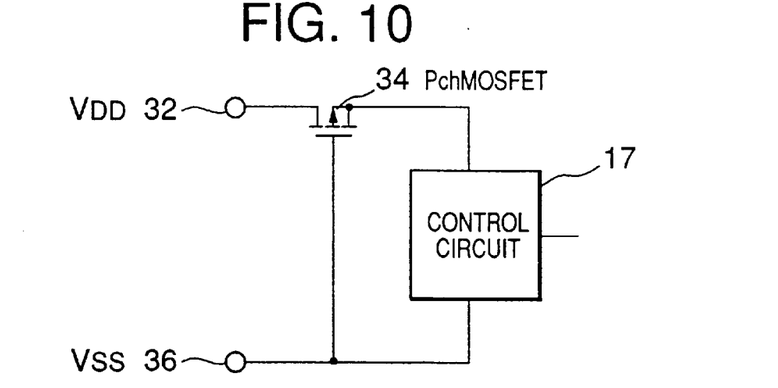
FIG. 10 is a block diagram showing the sketch of another conventional semiconductor device.
Figure 11:
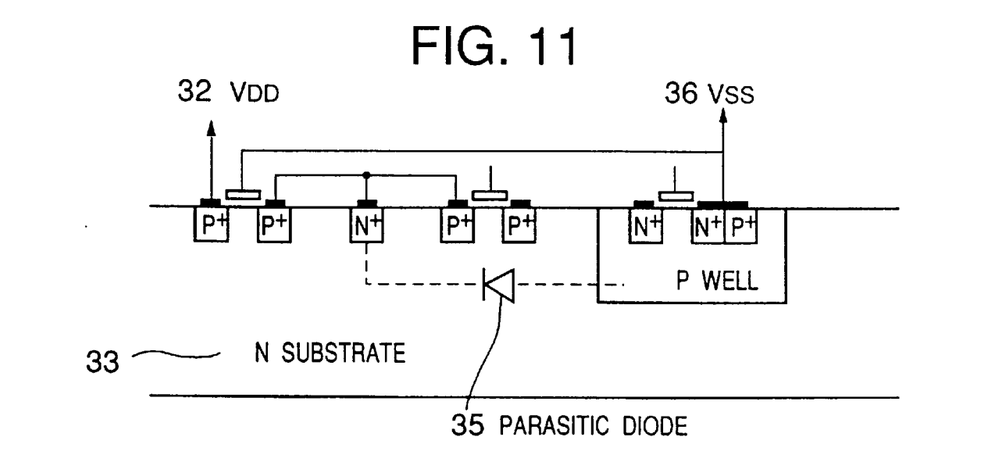
FIG. 11 is a cross-sectional view showing the structure of the device shown in FIG. 10.

FIG. 10 is a block diagram showing the sketch of the semiconductor device, and FIG. 11 is a cross-sectional view illustrative of the structure of the device shown in FIG. 10.

As shown in FIG. 10 and FIG. 11, the device has a PchMOSFET 34 connected between $V_{DD}$ 32 and an N substrate 33 to prevent short-circuit current from flowing through a parasitic diode 35 when $V_{DD} < V_{SS}$.

In the semiconductor device shown in FIG. 6, however, since the current limiting resistor 10 is inserted, there is no need to provide preventive measures against short-circuit current even when the $V_{DD}$ 32 is replaced by the input and the $V_{SS}$ by GND. Further, mounting the power MOSFET on the device shown in FIG. 10 and FIG. 11 inevitably makes a high voltage-withstand horizontal type power MOSFET which provides an undesirable high ON resistance (e.g. approximately 1.5 times for 70-volt voltage withstand).

The present invention has been accomplished in view of the problems with the prior arts described above, and it is an object of the present invention to provide a semiconductor device which is capable of preventing the damage to the device caused by the undesirable actuation of a parasitic NPN parasitic transistor.

SUMMARY OF THE INVENTION

It is therefore a principal object to provide a power MOSFET having a circuit for preventing a parasitic transistor from actuating.

A semiconductor device according to the present invention, an input signal source for generating an input signal, a first power terminal provided in a first semiconductor layer of a second conductivity type formed on a semiconductor substrate, a power MOSFET connected between said first power terminal and said semiconductor substrate of a first conductivity type as an output terminal and having a gate connected to a first node for controlling the supply of electric current to a load connected between said first power terminal and said output terminal, a control circuit receiving said input signal for controlling an operation of said power MOSFET in response to said input signal, an input terminal provided on a second semiconductor layer of said second conductivity type formed on said first semiconductor layer, a parasitic transistor having a first terminal connected to said second semiconductor layer, a second terminal connected to said semiconductor substrate, and a base terminal connected to said first semiconductor layer, and a switching circuit for keeping said parasitic transistor at non-conductive state when a voltage of said input terminal changes.

Therefore, the parasitic transistor is not actuated, making it possible to prevent damage to the semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Embodiments of the present invention will now be described with reference to the accompanying drawings.

Figure 1:
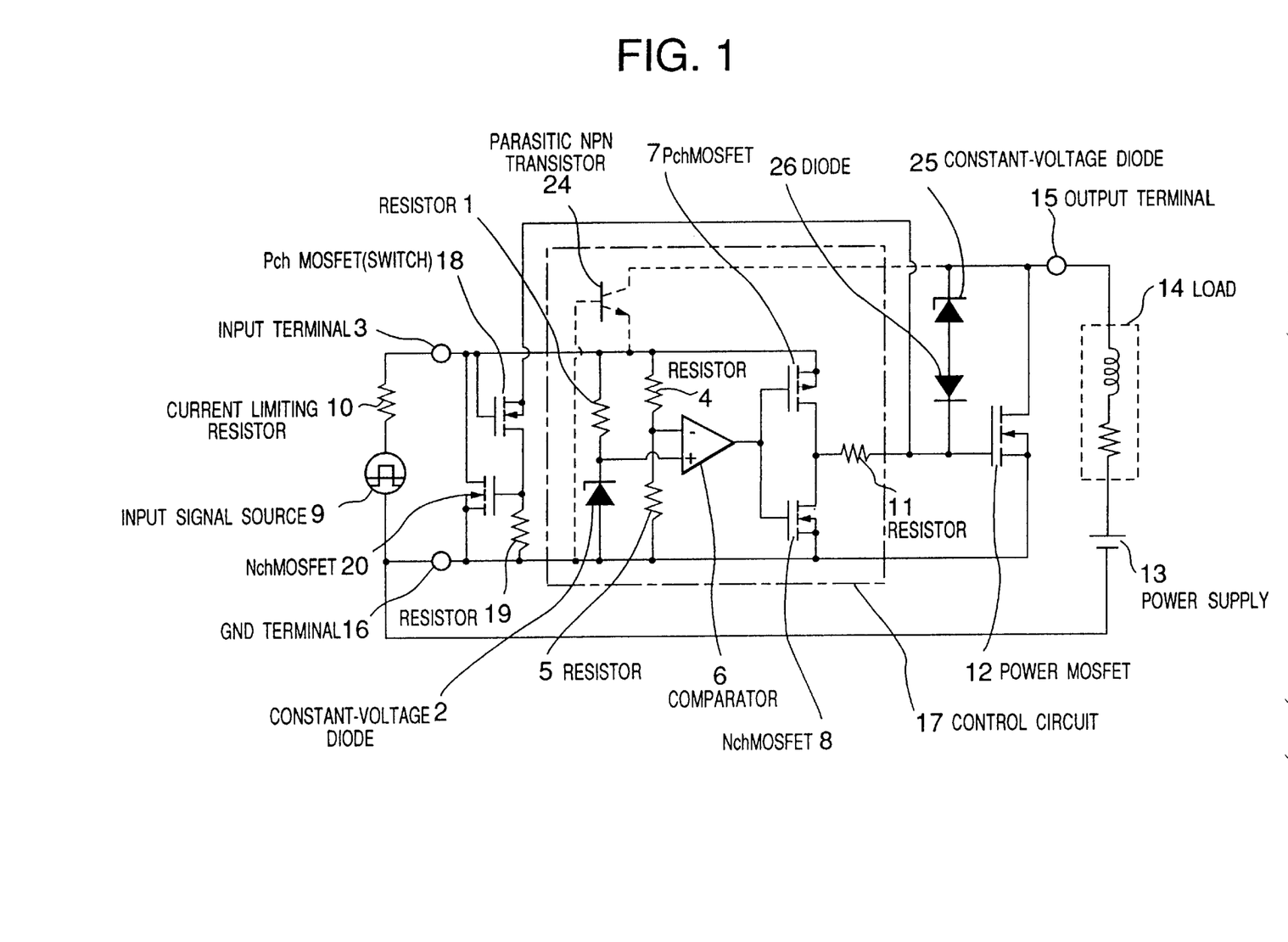
FIG. 1 is a circuit diagram showing a first embodiment of a semiconductor device in accordance with the present invention.

As shown in FIG. 1, the embodiment is constituted by an input signal source 9 for generating an input signal, a current limiting resistor 10 for limiting electric current flowing through the device, a power supply 13, a load 14, a power MOSFET 12 for controlling the supply of electric current to the load 14, a constant-voltage diode 25, a diode 26, a control circuit 17 for controlling the operation of the power MOSFET 12, an NchMOSFET 20 which is a first MOSFET and a PchMOSFET 18 which is a second MOSFET serving as a first switch for controlling the operation of the NchMOSFET 20, which are connected in parallel between an input terminal 3 and a GND terminal 16 of the control circuit 17, and a resistor 19 connected in series to the PchMOSFET 18; provided in the control circuit 17 and connected in parallel between the input terminal and the GND terminal are a resistor 1 and a constant-voltage diode 2, resistors 4 and 5, the comparator 6 which performs the comparison of the value of the voltage which has undergone the division through the resistors 4, 5, a PchMOSFET 7 and an NchMOSFET 8 in which the outputs from the comparator 6 are applied to the gate terminals thereof; also included in the control circuit 17 is a resistor 11 having one end thereof connected to the drain terminals of the PchMOSFET 7 and the NchMOSFET 8 and the other end thereof connected to the gate terminal of the power MOSFET 12; and there is also a parasitic NPN transistor 24 having a base terminal thereof connected to the GND terminal 16, an emitter terminal thereof connected to the input terminal 3, and a collector terminal thereof connected to an output terminal 15. In the NchMOSFET 20, the gate terminal is connected to the GND terminal 16 via a resistor 19, the source terminal is connected to the GND terminal 16, and the drain terminal is connected to the input terminal 3; and in the PchMOSFET 18, the gate terminal is connected to the input terminal 3, the drain terminal is connected to the gate terminal of the NchMOSFET 20, and the source terminal is connected to the gate terminal of the power MOSFET 12.

In the semiconductor device configured as described above, the resistor 1 and the constant-voltage diode 2 together generate a reference voltage; the reference voltage is compared with the value of voltage, which has been applied through the input terminal 3 and has undergone the division through the resistors 4 and 5, in the comparator 6.

Figure 2:
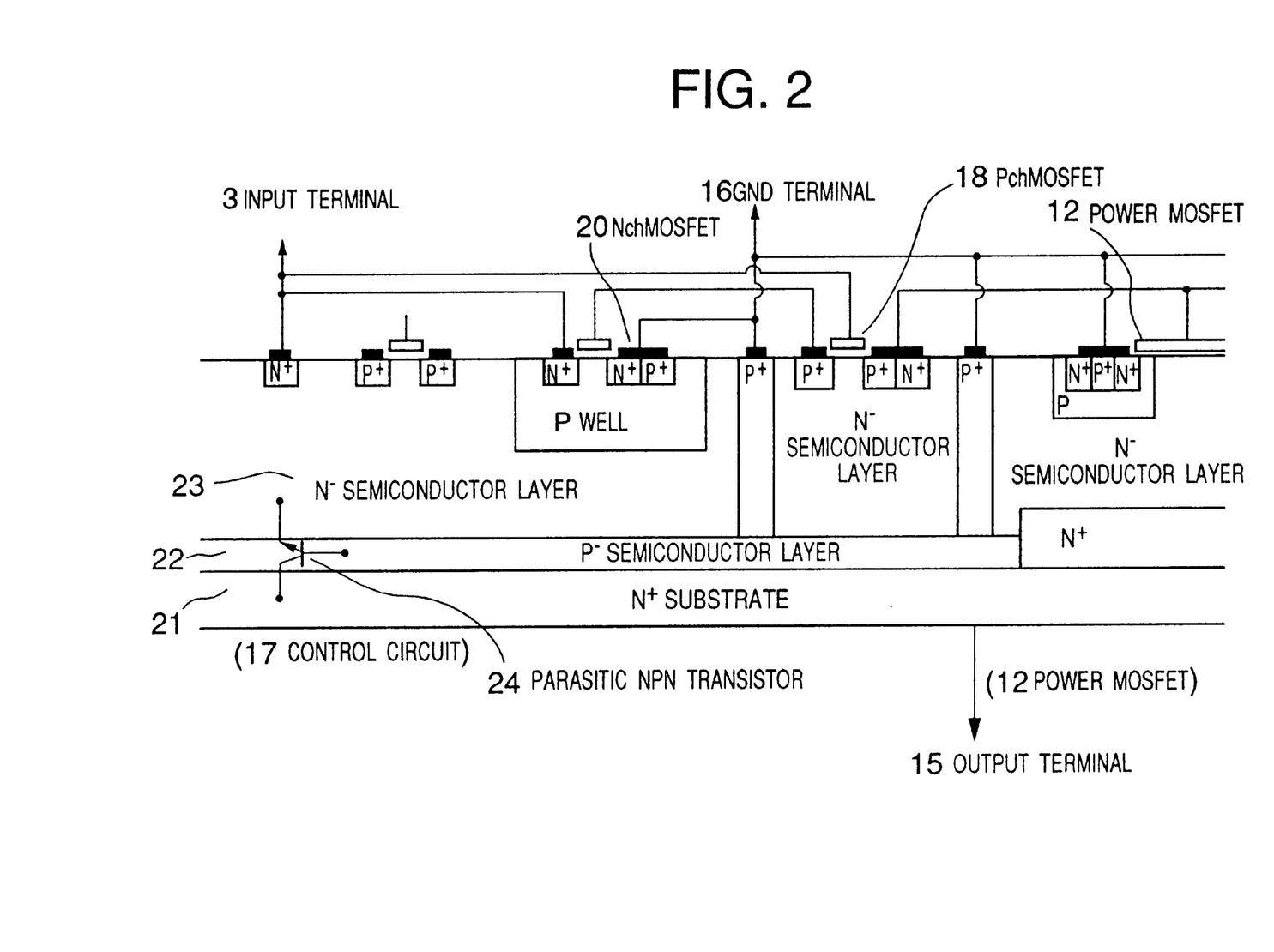
FIG. 2 is a cross-sectional view showing the structure of the semiconductor device shown in FIG. 1.

As shown in FIG. 2, the embodiment is comprised of an N+ substrate 21 serving as the output of the power MOSFET 12, a P− semiconductor layer 22 which is a first semiconductor layer joined onto the N+ substrate 21, and an N− semiconductor layer 23 serving as a second semiconductor layer which has the control circuit 17; the output terminal 15 is provided on the N+ substrate 21, the input terminal 3 is provided on the N− semiconductor layer 23, and the GND terminal 16 is provided on the P− semiconductor layer 22, respectively.

The operation of the semiconductor device configured as described above will now be described.

When the voltage output from the input signal source 9 rises and when the value of the voltage, which has undergone the division through the resistors 4 and 5, exceeds the constant voltage of the constant-voltage diode 2, the output of the comparator 6 switches to a low level.

This turns the PchMOSFET 7 ON and turns the NchMOSFET 8 OFF.

Thus electric charge is accumulated at the gate of the power MOSFET 12 and the power MOSFET 12 is placed in an ON state, causing electric current to flow from the power supply 13 to the load 14, the output terminal 15, and the GND terminal 16.

Next, the voltage output from the input signal source 9 lowers and when the value of the voltage, which has undergone the division through the resistors 4 and 5, goes down to the constant voltage of the constant-voltage diode 2 or lower, the output of the comparator 6 switches to a high level.

Then the PchMOSFET 7 turns OFF, whereas the NchMOSFET 8 turns ON.

This causes the electric charge, which has been accumulated at the gate of the power MOSFET 12, to be discharged. At this time, the PchMOSFET 18 turns ON, causing a voltage to be applied to the resistor 19, turning ON the NchMOSFET 20.

This, as illustrated in FIG. 2, causes the base and the emitter of the parasitic NPN transistor 24 to be short-circuited, wherein the parasitic NPN transistor 24 uses as the collector thereof the N+ substrate 21 serving as the output of the power MOSFET 12, uses as the base thereof the P− semiconductor layer 22 connected to the GND terminal 16, and uses as the emitter thereof the N− semiconductor layer 23; therefore, even when the voltage at the input signal source 9 is the voltage at the GND terminal 16 or lower, the voltage difference between the base and the emitter can be made smaller than the operating voltage (approximately 0.7 V) between the base and the emitter of the parasitic NPN transistor 24, making it possible to prevent the parasitic NPN transistor 24 from being actuated.

Next, when the gate voltage of the power MOSFET 12 goes down, the voltage at the output terminal 15 goes up, and electric current flows to the input terminal 3 or the PchMOSFET 18, the resistor 19, and the GND terminal 16 via the constant-voltage diode 25, the diode 26, the resistor 11, and between the drain and the source of the PchMOSFET 7.

The electric current biases the gate of the MOSFET 12, so that the energy accumulated at the reactance of the load 14 is discharged, and the PchMOSFET 18 is turned ON and kept ON, that is, the NchMOSFET 20 is turned ON and kept ON, until the voltage at the output terminal 15 goes down, thus preventing the parasitic NPN transistor 24 from being actuated while the voltage at the output terminal 15 is high.

Therefore, when the electric charge accumulated in the power MOSFET is discharged, the first switch is operated to turn ON the first MOSFET so as to cause short circuit across the base and the emitter of the parasitic transistor. Thus, the parasitic transistor is not actuated, making it possible to prevent damage to the semiconductor device.

Figure 3:
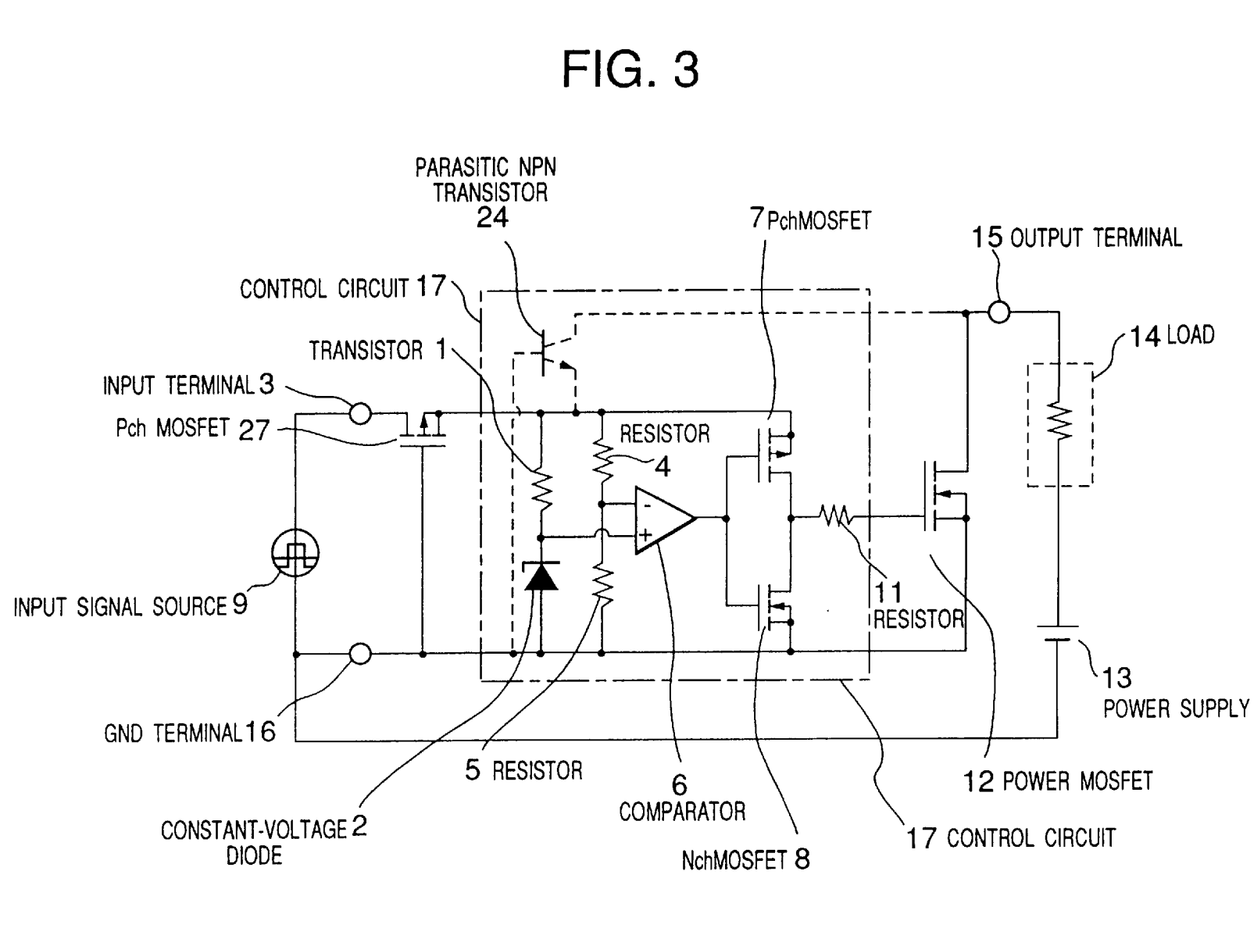
FIG. 3 is a circuit diagram showing a second embodiment of the semiconductor device in accordance with the present invention.

FIG. 3 is a circuit diagram showing a second embodiment of the semiconductor device in accordance with the present invention.

As shown in FIG. 3, the embodiment is constituted by an input signal source 9 for generating an input signal, a power supply 13, a load 14, a power MOSFET 12 for controlling the supply of electric current to the load 14, a control circuit 17 for controlling the operation of the power MOSFET 12, and a PchMOSFET 27 which is a third MOSFET connected between the input signal source 9 and the control circuit 17; provided in the control circuit 17 and connected in parallel between the source terminal of the PchMOSFET 27 and a GND terminal 16 are a resistor 1 and a constant-voltage diode 2, resistors 4 and 5, the comparator 6 which performs the comparison of the value of the voltage which has undergone the division through the resistors 4, 5, and a PchMOSFET 7 and a NchMOSFET 8 in which the outputs from the comparator 6 are applied to the gate terminals thereof; a resistor 11 is also included in the control circuit 17, the resistor 11 having one end thereof connected to the drain terminals of the PchMOSFET 7 and the NchMOSFET 8 and the other end thereof connected to the gate terminal of the power MOSFET 12; and there is also a parasitic NPN transistor 24 having the base terminal thereof connected to the GND terminal 16, the emitter terminal thereof connected to the source terminal of the PchMOSFET 27, and the collector terminal thereof connected to an output terminal 15. In the PchMOSFET 27, the gate terminal is connected to the GND terminal 16, the source terminal is connected to the control circuit 17, and the drain terminal is connected to the input terminal 3.

The operation of the semiconductor device thus configured will now be described.

When the voltage at the input signal source 9 rises and exceeds the sum of the diode voltage (about 0.7 V) across the drain and the source of the PchMOSFET 27 and the threshold voltage (about 1 V), the PchMOSFET 27 turns ON; and when the voltage at the input signal source 9 rises and reaches a high level, the control circuit 17 causes electric charge to be accumulated at the gate of the power MOSFET 12, turning the power MOSFET 12 ON.

Next, when the voltage of the input signal source 9 decreases down to the voltage at the GND terminal 16 or lower, the electric charge accumulated at the gate of the power MOSFET 12 starts to flow into the input terminal 3 from the PchMOSFET 27, which has the gate thereof biased, via the resistor 11 and the diode between the drain and the source of the PchMOSFET 7.

Figure 4:
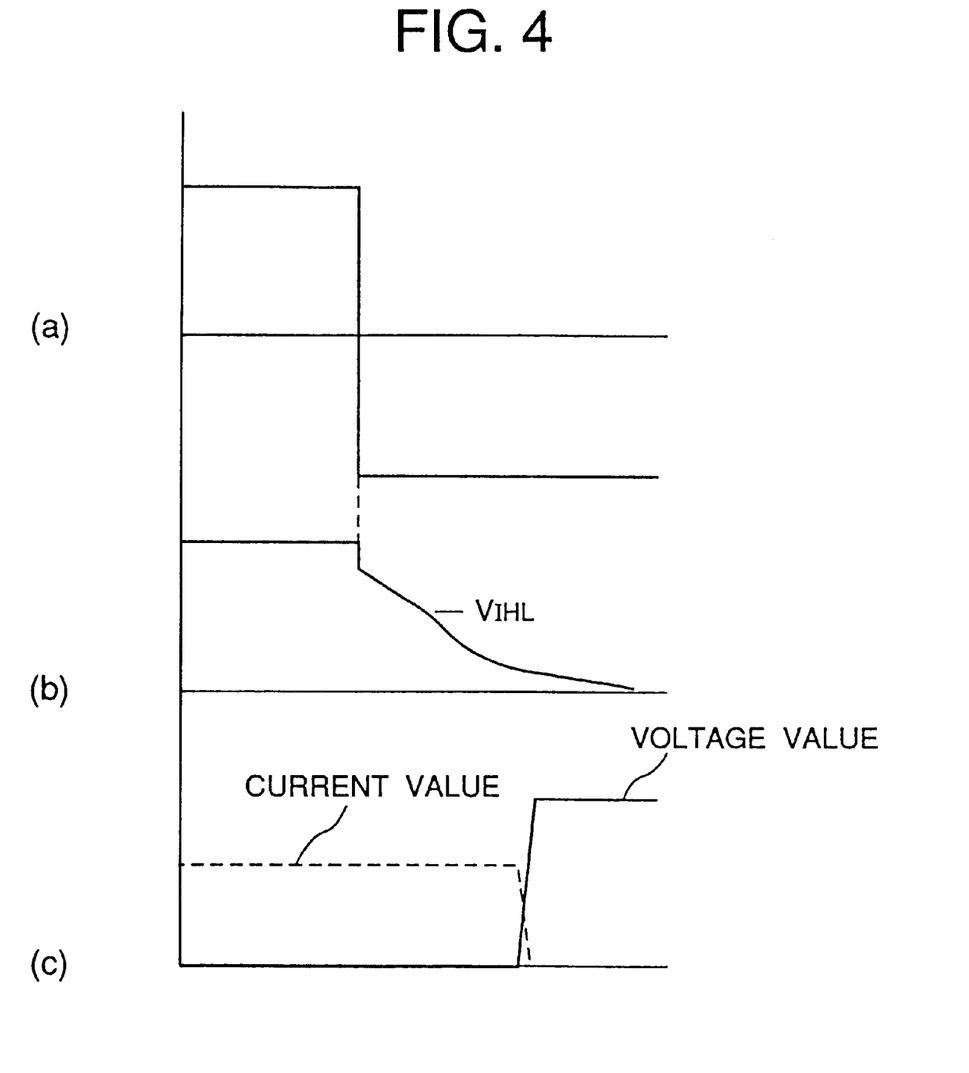
FIG. 4 is a diagram for illustrating the operation of the semiconductor device shown in FIG. 3; (a) is a chart showing the voltage value at an input terminal, (b) is a chart showing the source voltage of a PchMOSFET, and (c) is a chart showing the voltage value and the current value at an output terminal.

FIG. 4 illustrates the operation of the semiconductor device shown in FIG. 3; (a) shows the voltage value at the input terminal 3, (b) shows the voltage of the source of the PchMOSFET 27, and (c) shows the voltage value and the current value at the output terminal 15.

When the source voltage of the PchMOSFET 27 reaches judgment voltage $V_{IHL}$ for determining the low level and the high level of the control circuit 17, the NchMOSFET 8 is placed in the ON state. This causes the source voltage of the PchMOSFET 27 to become nearly zero volt and the control circuit 17 stops operating.

Thus, the electric charge accumulated at the gate of the power MOSFET 12 is discharged in an unstable state wherein the NchMOSFET 8 is OFF, and upon completion of the discharge, the power MOSFET 12 turns OFF.

At this time, the source voltage of the PchMOSFET 27 gradually decreases, but it does not lower below the voltage at the GND terminal 16 because the PchMOSFET 27 turns OFF at the threshold voltage (about 1 V). Hence, the parasitic NPN transistor 24 is not actuated.

As described above, in this embodiment, when the voltage at the input signal source 9 decreases down to the voltage at the GND terminal 16 or lower, the electric charge accumulated at the gate of the power MOSFET 12 is discharged and electric current flows to the PchMOSFET 27 until the discharge is completed. Upon completion of the discharge, the electric current stops; therefore, the parasitic transistor is not actuated.

Figure 5:
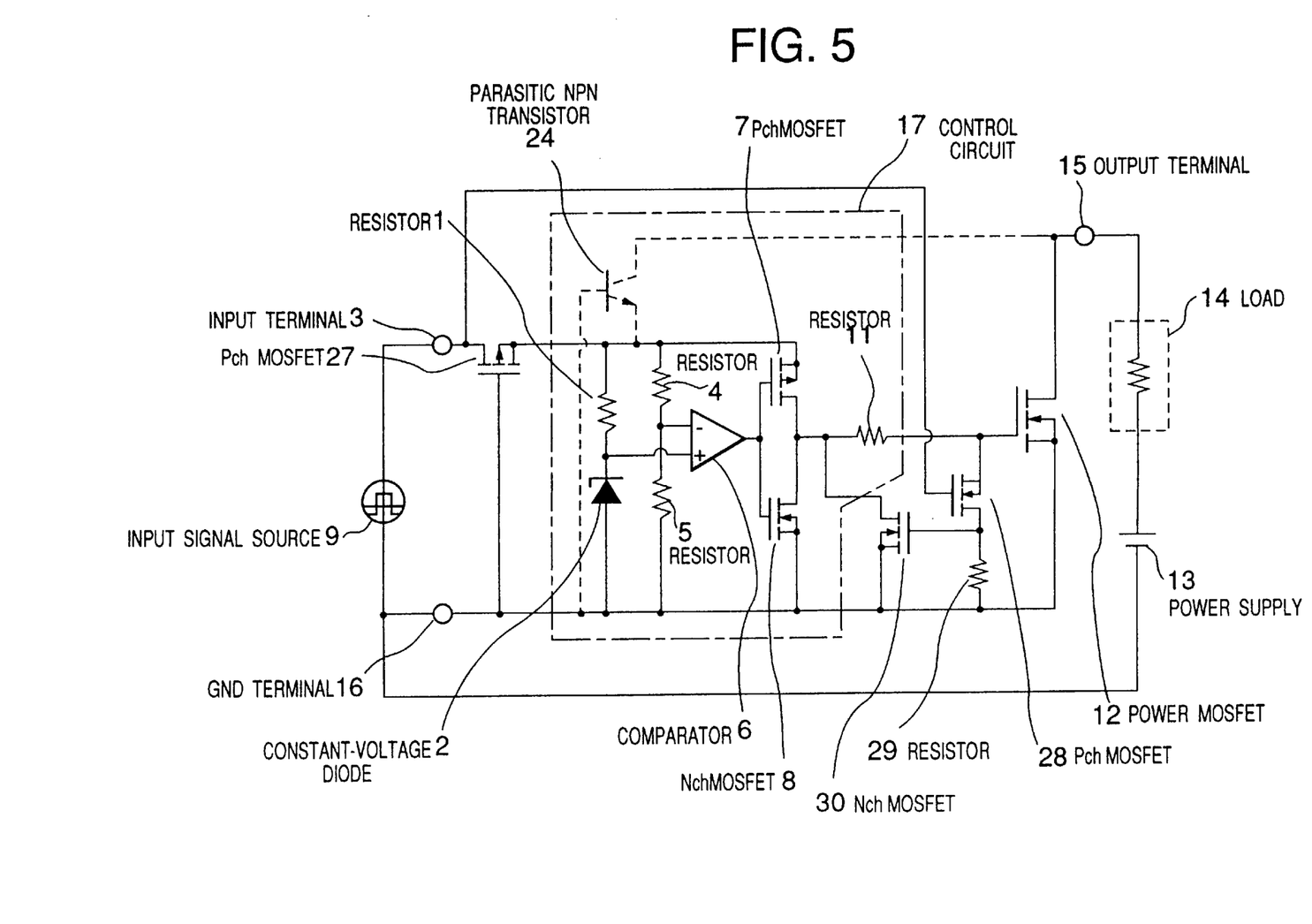
FIG. 5 is a circuit diagram showing a third embodiment of the semiconductor device in accordance with the present invention.

FIG. 5 is a circuit diagram showing a third embodiment of the semiconductor device in accordance with the present invention.

As shown in FIG. 5, this embodiment is composed of an input signal source 9 for generating an input signal, a power supply 13, a load 14, a power MOSFET 12 for controlling the supply of electric currents to the load 14, a control circuit 17 for controlling the operation of the power MOSFET 12, and an NchMOSFET 30 which is a fourth MOSFET connected to an output stage of the control circuit 17, a PchMOSFET 28 which is a fifth MOSFET serving as a second switch for controlling the operation of the NchMOSFET 30, a resistor 29 connected in series with the PchMOSFET 28, and a PchMOSFET 27 connected between the input signal source 9 and the control circuit 17; included in the control circuit 17 and connected in parallel between the source terminal of the PchMOSFET 27 and a GND terminal 16 are a resistor 1 and a constant-voltage diode 2, resistors 4, 5, a comparator 6 which performs the comparison of the value of the voltage which has undergone the division through the resistors 4, 5, and a PchMOSFET 7 and an NchMOSFET 8 in which the outputs from the comparator 6 are applied to the gate terminals thereof; also included in the control circuit 17 is a resistor 11 having one end thereof connected to the drain terminals of the PchMOSFET 7 and the NchMOSFET 8 and the other end thereof connected to the gate terminal of the power MOSFET 12; and there is also a parasitic NPN transistor 24 having the base terminal thereof connected to the GND terminal 16, the emitter terminal thereof connected to the source terminal of the PchMOSFET 27, and the collector terminal thereof connected to an output terminal 15. In the NchMOSFET 30, the gate terminal is connected to the GND terminal 16 via a resistor 29, the source terminal is connected to the GND terminal 16, and the drain terminal is connected to the drain terminals of the PchMOSFET 7 and the NchMOSFET 8. In the PchMOSFET 28, the gate terminal is connected to the input terminal 3, the drain terminal is connected to the gate terminal of the NchMOSFET 30, and the source terminal is connected to the gate terminal of the power MOSFET 12.

The operation of the semiconductor device thus configured will now be described.

When the voltage at the input signal source 9 lowers down to the voltage at the GND terminal 16 or below, the PchMOSFET 28 turns ON, causing the NchMOSFET 30 to turn ON.

And the electric charge accumulated at the gate of the power MOSFET 12 is discharged through the resistor 11 and the NchMOSFET 30.

Thus, the control circuit 17 is placed in the OFF state without developing an unstable operation, and the voltage between the gate and the source of the PchMOSFET 27 becomes nearly zero, stopping the flow of the electric current to the PchMOSFET 27.

Hence, even when the signal output from the input signal source 9 is given by other semiconductor device or the like having a lower driving capability, quick turning OFF can be secured.

In the embodiments described above, the description has been given to the circuit which employs the Nch power MOSFET and has a parasitic NPN transistor; if the Pch-MOSFET is used and the parasitic PNP transistor is present, then the similar advantage will be obtained by replacing the PchMOSFET 18 by an NchMOSFET, the NchMOSFET 20 by a PchMOSFET, the PchMOSFET 27 by an NchMOSFET, the PchMOSFET 28 by an NchMOSFET, and the NchMOSFET 30 by a PchMOSFET.

Therefore, the emitter voltage of the parasitic transistor does not become lower than the base voltage and the parasitic transistor is not actuated. This enables prevention of damage to the semiconductor device caused by the parasitic transistor being actuated.

I claim:

1. A semiconductor device comprising:

an input signal source for generating an input signal;

a first power terminal provided in a first semiconductor layer of a second conductivity type formed on a semiconductor substrate;

a power MOSFET connected between said first power terminal and an output terminal connected to said semiconductor substrate of a first conductivity types said power MOSFET having a gate connected to a first node for controlling a supply of electric current to a load connected between said first power terminal and said output terminal;

a control circuit receiving said input signal for controlling an operation of said power MOSFET in response to said input signal;

an input terminal provided on a second semiconductor layer of said second conductivity type formed on said first semiconductor layer;

a parasitic transistor having a first terminal connected to said second semiconductor layer, a second terminal connected to said semiconductor substrate, and a base terminal connected to said first semiconductor layer;

a first transistor of the first conductivity type connected between said input terminal and said first power terminal, said first transistor having a gate terminal connected to a second node; and a first switch connected between said first node and second node for turning on said first transistor when a voltage of said first node is higher than a voltage of said second node.

2. The semiconductor device according to claim 1, wherein
said first switch has a second MOSFET of said second conductive type connected between said first node and said second node and having a gate connected to said input node, and a resistive element connected between said second node and said first power terminal.

3. A semiconductor device comprising:

an input signal source for generating an input signal;

a first power terminal provided in a first semiconductor layer of a second conductivity type formed on a semiconductor substrate;

a power MOSFET connected between said first power terminal and an output terminal connected to said semiconductor substrate of a first conductivity type, said power MOSFET having a gate connected to a first node for controlling the supply of electric current to a load connected between said first power terminal and said output terminal;

a control circuit receiving said input signal for controlling an operation of said power MOSFET in response to said input signal;

an input terminal provided on a second semiconductor layer of said second conductivity type formed on said first semiconductor layer;

a parasitic transistor having a first terminal connected to said second semiconductor layer, a second terminal connected to said semiconductor substrate, and a base terminal connected to said first semiconductor layer; and a switching circuit connected between said input terminal and said control circuit, said switching circuit connecting said input terminal to said control circuit when a voltage of said input terminal is higher than a predetermined voltage, and said switching circuit disconnecting said input terminal from said control circuit when a voltage of said input terminal is lower than said predetermined voltage;

wherein said switching circuit has a first transistor of said first conductivity type connected between said input terminal and said control terminal and having gate connected to said first power terminal.

4. A semiconductor device comprising:

an input signal source for generating an input signal;

a first power terminal provided in a first semiconductor layer of a second conductivity type formed on a semiconductor substrate;

a power MOSFET connected between said first power terminal and an output terminal connected to said semiconductor substrate of a first conductivity types said power MOSFET having a gate connected to a first node for controlling a supply of electric current to a load connected between said first power terminal and said output terminal;

a control circuit receiving said input signal for controlling an operation of said power MOSFET in response to said input signal;

an input terminal provided on a second semiconductor layer of said second conductivity type formed on said first semiconductor layer;

a parasitic transistor having a first terminal connected to said second semiconductor layer, a second terminal connected to said semiconductor substrate, and a base terminal connected to said first semiconductor layer;

a first switching circuit connected between said input terminal and said control circuit said first switching circuit connecting said input terminal to said control circuit when a voltage of said input terminal is higher than a first predetermined voltage, and said first switching circuit disconnecting said input terminal from said control circuit when a voltage of said input terminal is lower than said first predetermined voltage; and a second switching circuit connected between said first node and said first power terminal for discharging an electric charge of said power MOS transistor when a voltage of said input terminal is lower than a second predetermined voltage.

5. The semiconductor device according to claim 4, wherein said first switching circuit has a first transistor of said first conductivity type connected between said input terminal and said control terminal and having gate connected to said first power terminal.

6. The semiconductor device according to claim 4, wherein said second switching circuit has a second transistor of said second conductivity type connected between said first node and said first power terminal and having a gate connected to a third node, a third transistor of said first conductivity type connected between said first node and said third node and having a gate connected to said input terminal, and a resistive element connected between said third node and said first power terminal.

* * * * *